(12) United States Patent
Yamada

(10) Patent No.: US 12,198,970 B2
(45) Date of Patent: Jan. 14, 2025

(54) METHOD OF MANUFACTURING DISPLAY DEVICE AND DISPLAY DEVICE

(71) Applicant: Japan Display Inc., Tokyo (JP)

(72) Inventor: Kazuyuki Yamada, Tokyo (JP)

(73) Assignee: Japan Display Inc., Tokyo (JP)

( * ) Notice: Subject to any disclaimer, the term of this patent is extended or adjusted under 35 U.S.C. 154(b) by 400 days.

(21) Appl. No.: 17/653,685

(22) Filed: Mar. 7, 2022

(65) Prior Publication Data

US 2022/0189814 A1 Jun. 16, 2022

Related U.S. Application Data

(63) Continuation of application No. PCT/JP2020/029982, filed on Aug. 5, 2020.

(30) Foreign Application Priority Data

Sep. 10, 2019 (JP) .................... 2019-164883

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01); *H01L 2221/68309* (2013.01); *H01L 2221/68354* (2013.01); *H01L 2221/68363* (2013.01); *H01L 2933/0066* (2013.01)

(58) Field of Classification Search
CPC .......................... H01L 25/0753; H01L 33/62
See application file for complete search history.

(56) References Cited

U.S. PATENT DOCUMENTS

2002/0064032 A1   5/2002  Oohata

FOREIGN PATENT DOCUMENTS

JP   2002-118124 A    4/2002
JP   2020-096068 A    6/2020
KR   1020180038223 A  4/2018

OTHER PUBLICATIONS

International Search Report issued Sep. 15, 2020 in PCT/JP2020/029982 filed on Aug. 5, 2020, 2 pages.
Office Action issued on Jun. 13, 2023, in corresponding Japanese Application No. 2019164883, 6 pages.

*Primary Examiner* — Anthony Ho
(74) *Attorney, Agent, or Firm* — Maier & Maier, PLLC

(57) ABSTRACT

According to one embodiment, a method of manufacturing a display device is provided. The display device includes a mounting substrate and a plurality of light-emitting elements two-dimensionally arrayed and mounted on the mounting substrate. The plurality of light-emitting elements have a planar shape that is non-rotationally symmetric and non-linearly symmetric. The method includes preparing the plurality of light-emitting elements separated from each other, preparing an array guide member, and aligning the plurality of light-emitting elements following the two-dimensional array of the opening portion group.

8 Claims, 7 Drawing Sheets

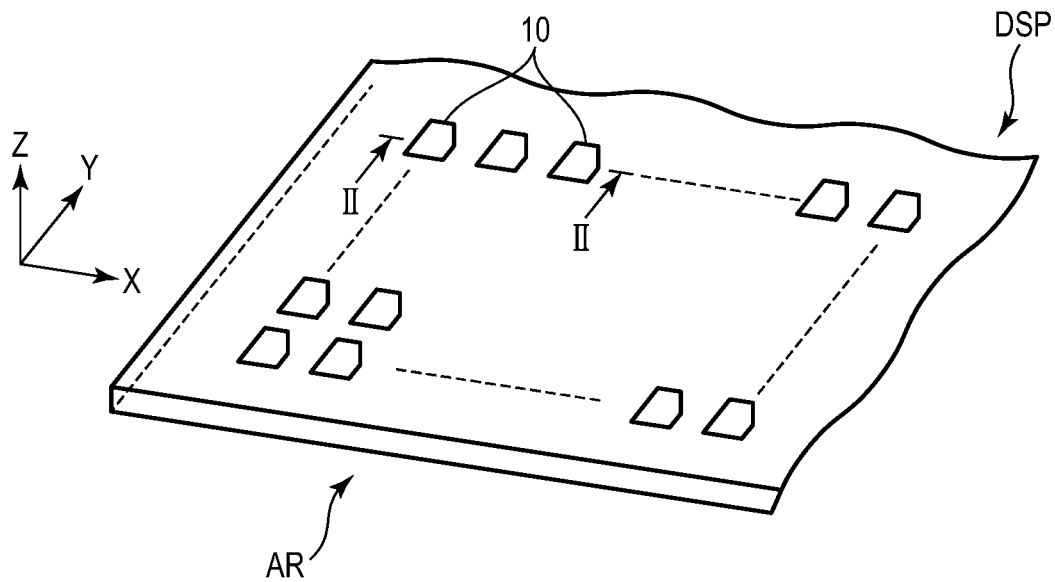
F I G. 1
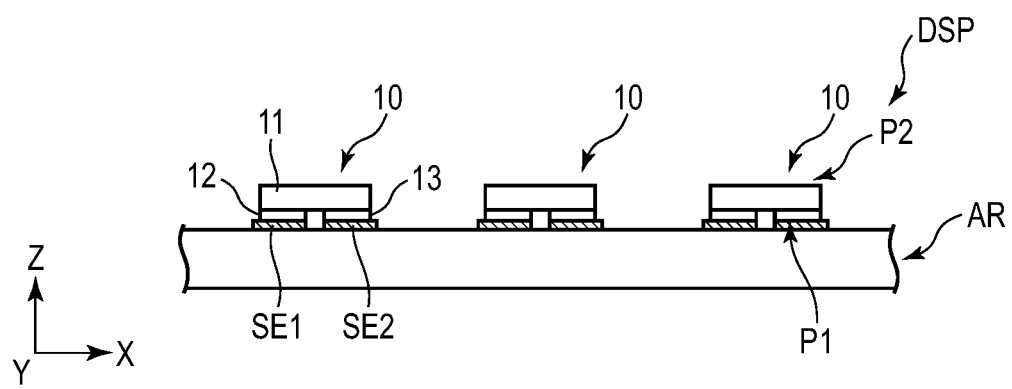
F I G. 2

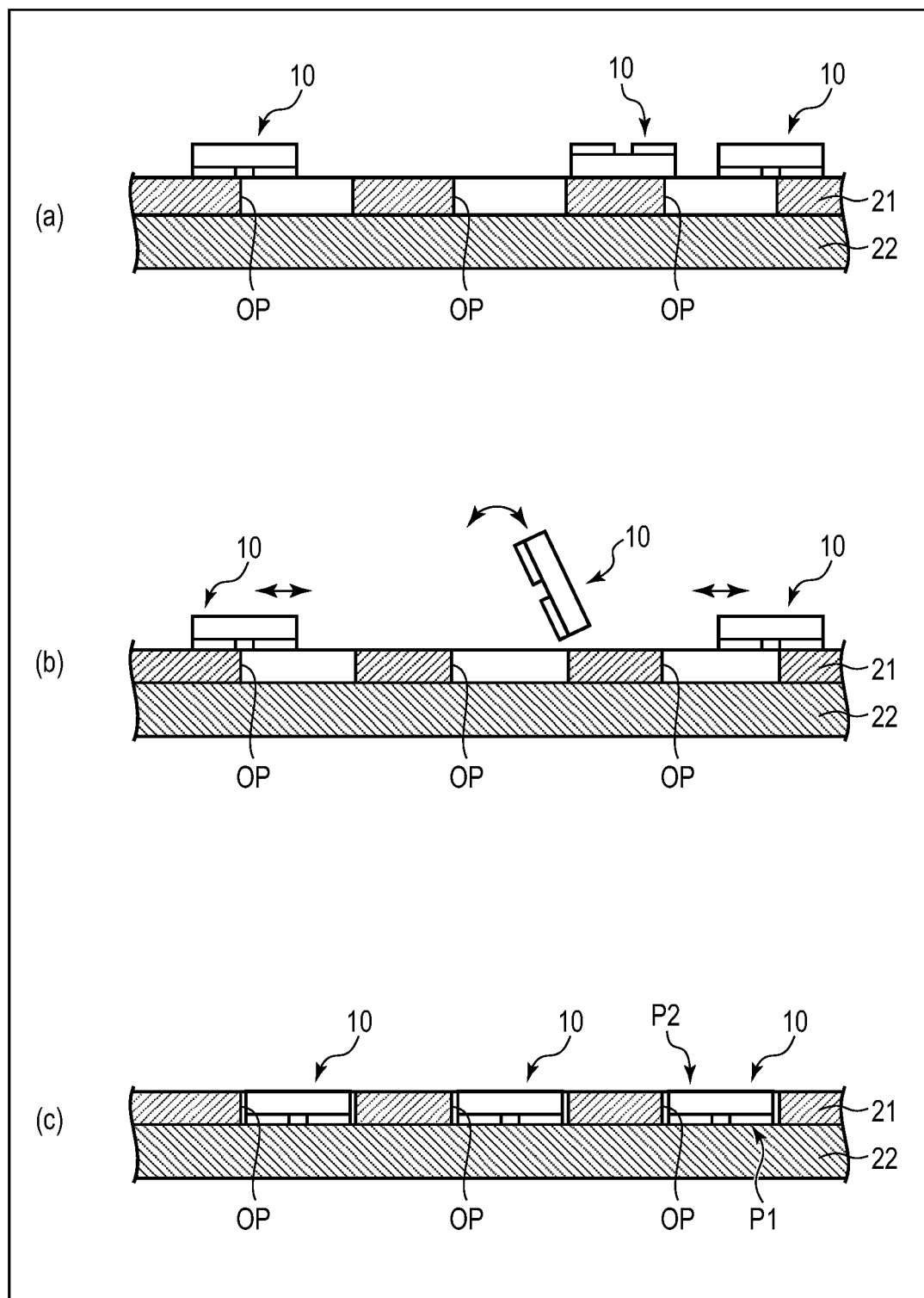
F I G. 6

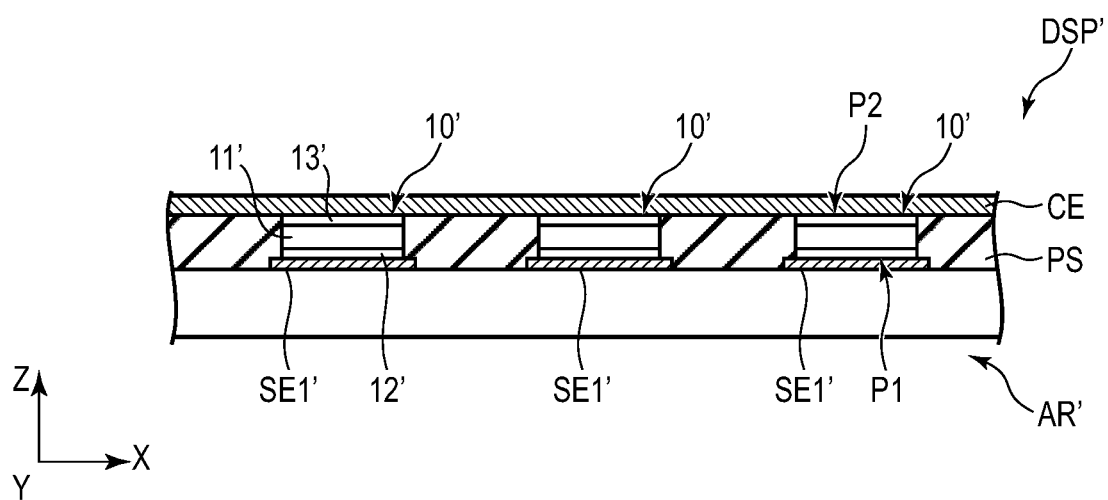
F I G. 10

METHOD OF MANUFACTURING DISPLAY DEVICE AND DISPLAY DEVICE

CROSS-REFERENCE TO RELATED APPLICATIONS

This application is a Continuation Application of PCT Application No. PCT/JP2020/029982, filed Aug. 5, 2020 and based upon and claiming the benefit of priority from Japanese Patent Application No. 2019-164883, filed Sep. 10, 2019, the entire contents of all of which are incorporated herein by reference.

FIELD

An embodiment of the present invention relates to a method of manufacturing a display device and a display device.

BACKGROUND

An LED display device using a light-emitting diode (LED) which is a spontaneous light-emitting element is known. In recent years, as a display device with higher definition, a display device (hereinafter, referred to as a micro LED display device) using a minute light-emitting diode element called a micro LED has been developed.

Unlike the conventional liquid crystal display or organic EL display, the micro LED display device is formed by mounting a large number of chip-like micro LEDs in a display area. For this reason, the display device is easy to achieve both high definition and increase in size, and therefore, is attracting attention as a next-generation display. The micro LEDs are integrated and formed on a single crystal sapphire wafer or the like using a semiconductor process.

In the manufacture of the micro LED display device, a method of transferring a micro LED onto a mounting substrate using array on a wafer at the time of integration formation has been adopted when mounting the micro LED on the mounting substrate.

BRIEF DESCRIPTION OF THE DRAWINGS

FIG. 1 is a perspective view schematically illustrating a configuration of a display device.

FIG. 2 is a schematic partial cross-sectional view taken along line II-II of FIG. 1.

FIG. 6 is a schematic partial cross-sectional view sequentially illustrating an aligning step.

FIG. 10 is a schematic partial cross-sectional view illustrating another example of the display device.

DETAILED DESCRIPTION

Figure 3:
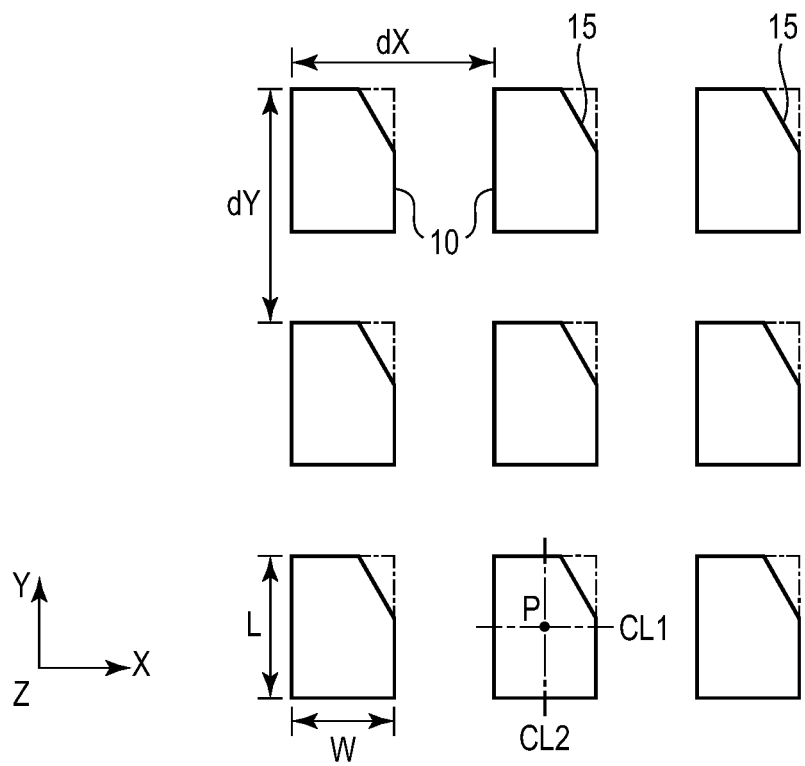
FIG. 3 is a plan view illustrating a planar shape and a two-dimensional array of a plurality of light-emitting elements in FIG. 1.

In general, according to one embodiment, a method of manufacturing a display device is provided. The display device includes a mounting substrate and a plurality of light-emitting elements two-dimensionally arrayed and mounted on the mounting substrate. The plurality of light-emitting elements have a planar shape that is non-rotationally symmetric with respect to an axis line perpendicular to a plane of the two-dimensional array and is non-linearly symmetric with respect to an axis line parallel to the plane of the two-dimensional array. The method includes preparing the plurality of light-emitting elements separated from each other. The method includes preparing an array guide member that includes a plate-like base and an opening portion group that is two-dimensionally arrayed on the base and has a plurality of opening portions having a shape similar to a planar shape of the light-emitting element and a slightly large dimension and penetrating therethrough. And, the method includes installing the array guide member horizontally, fitting the plurality of light-emitting elements into the plurality of opening portions of the opening portion group of the array guide member, and aligning the plurality of light-emitting elements following the two-dimensional array of the opening portion group.

In general, according to another embodiment, a display device is provided. The display comprises a mounting substrate and a plurality of light-emitting elements that are two-dimensionally arrayed and mounted on the mounting substrate. The plurality of light-emitting elements have a planar shape that is non-rotationally symmetric with respect to an axis line perpendicular to a plane of the two-dimensional array and is non-linearly symmetric with respect to an axis line parallel to the plane of the two-dimensional array. And, the plurality of light-emitting elements include a first light-emitting element exhibiting a first color, a second light-emitting element exhibiting a second color, and a third light-emitting element exhibiting a third color, and the first light-emitting element, the second light-emitting element, and the third light-emitting element are different in a planar shape from each other.

With the above-described conventional mounting method described in the Background, it is difficult to mount light-emitting elements that are separated from a wafer and dispersed, or light-emitting elements having an array that does not adapt a pixel array of a mounting substrate on the wafer. This is because the light-emitting element is so fine that it is difficult to visually recognize with naked eyes, and a large number of light-emitting elements are mounted on the mounting substrate. In order to efficiently mount the light-emitting elements separated from each other on the mounting substrate, a technique for aligning a posture and a two-dimensional array of the light-emitting elements with high accuracy in advance and conforming the light-emitting elements to the pixel array of the mounting substrate is required.

An object of the present embodiment is to provide a method of manufacturing a display device which can efficiently align light-emitting elements and efficiently mount the light-emitting elements on a mounting substrate, and a display device which can be manufactured by the manufacturing method.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

An embodiment of the present disclosure relates to a method of manufacturing a display device. Hereinafter, a display device that can be manufactured using the method of manufacturing a display device will be described. Here, the display device will be described as a micro LED display device using a micro light-emitting diode (hereinafter, referred to as a micro LED) which is a spontaneous light-emitting element.

FIG. 1 is a perspective view schematically illustrating a configuration of a display device DSP. FIG. 2 is a schematic partial cross-sectional view taken along line II-II of FIG. 1. FIG. 3 is a plan view illustrating a planar shape and a two-dimensional array of a light-emitting element 10 in FIG. 1.

FIG. 1 illustrates a three-dimensional space defined by a first direction X, a second direction Y perpendicular to the first direction X and a third direction Z perpendicular to the first direction X and the second direction Y. Note that the first direction X, the second direction Y and the third direction Z are orthogonal are orthogonal to each other, but may intersect at an angle other than 90°. In the following descriptions, the third direction Z is defined as "upward" and a direction opposite to the third direction is defined as "downward". Further, with such expressions "a second member above a first member" and "a second member below a first member", the second member may be in contact with the first member or may be remote from the first member.

The display device DSP includes a mounting substrate AR and a plurality of light-emitting elements 10 mounted on the mounting substrate AR. In FIG. 1, a display surface of the display device DSP, that is, a light emission surface faces upward, and a back surface faces downward.

As illustrated in FIG. 1, the mounting substrate AR has, for example, a rectangular shape. A main surface of the mounting substrate AR is parallel to an X-Y plane defined by a first direction X and a second direction Y. A thickness direction of the mounting substrate AR corresponds to a third direction Z. A plurality of light-emitting elements 10 are two-dimensionally arrayed and mounted on the mounting substrate AR.

As illustrated in FIG. 2, a pair of first wiring electrode SE1 and second wiring electrode SE2 is formed on an upper surface of the mounting substrate AR in accordance with each of the light-emitting elements 10. The pair of first wiring electrode SE1 and second wiring electrode SE2 are two-dimensionally arrayed and disposed on the mounting substrate AR similarly to the light-emitting element 10. The mounting substrate AR further includes an insulating substrate, various wiring layers formed over the insulating substrate, pixel circuits (including various switching elements such as drive transistors, various capacitors, and the like) according to each of the light-emitting elements 10, or the like. The detailed configuration of the mounting substrate AR will not be described.

Each of the light-emitting elements 10 is mounted over the first wiring electrode SE1 and the second wiring electrode SE2. The light-emitting element 10 includes a light emitting layer 11, and a first electrode 12 and a second electrode 13 disposed below the light emitting layer 11. The first electrode 12 is disposed over and electrically connected to the first wiring electrode SE1. The second electrode 13 is disposed over and electrically connected to the second wiring electrode SE2. The pair of first wiring electrode SE1 and second wiring electrode SE2 functions as a mounting region of the light-emitting element 10.

The light-emitting element 10 has a mounting surface P1 which is a surface on a side connected to the mounting substrate AR and a main light emitting surface P2 which is a surface on a side from which light is emitted. More precisely, in the light-emitting element 10, light is emitted in all directions including the mounting surface P1 side. The main light emitting surface P2 is a surface from which main light is emitted when used as the display device DSP. In the present embodiment, the surface including the first electrode 12 and the second electrode 13 is the mounting surface P1.

The plurality of light-emitting elements 10 have a planar shape that is non-rotationally symmetric with respect to an axis line perpendicular to a plane of a two-dimensional array and is non-linearly symmetric with respect to an axis line parallel to the plane of the two-dimensional array. As illustrated in FIG. 3, in the present embodiment, the light-emitting element 10 has a general shape of a rectangular shape. The light-emitting element has dimensions of a width W, a length L, and a thickness T (not illustrated) (thickness T<length L, and width W). The light-emitting element 10 has a planar shape obtained by notching one of four corner portions of a rectangle (width W<length L) into a non-linearly symmetric triangle. The plurality of light-emitting elements 10 are disposed on the mounting substrate AR at intervals dX in the first direction X and at intervals dY in the second direction Y. The light-emitting elements 10 are aligned on the mounting substrate AR in a posture in which a notch 15 is directed to an upper right.

The above-described non-rotational symmetry means that a shape rotated by one rotation on the axis line (an axis line parallel to the third direction Z, for example, a center point P) perpendicular to the plane of the two-dimensional array (X-Y plane) matches an original shape only when rotated by 360°, and does not match the original shape when rotated by another angle. In other words, the planar shape of the light-emitting element 10 has only one-time rotational symmetry. The above-described non-linear symmetry means that any of line segments (for example, center lines CL1 and CL2 along the first direction X and the second direction Y, respectively) parallel to the plane (X-Y plane) of the two-dimensional array is not a linearly symmetric with respect to the axis line. In other words, the planar shape of the light-emitting element 10 does not match the original shape even if the mounting surface P1 and the main light emitting surface P2 are vertically inverted from each other.

The light-emitting element 10 is a micro LED chip as described above, and is also referred to as a flip chip type micro LED. An area of the light-emitting element 10 is defined by width W×length L. The area is, for example, 25 $\mu m^2$ or more and 10,000 $\mu m^2$ or less. The width W and the length L are, for example, 5 μm or more and 300 μm or less. The light emitting layer 11 includes a P/N bonding layer. The light-emitting element 10 is supplied a current through the first wiring electrode SE1 and the second wiring electrode SE2 with the first electrode 12 side as positive and the second electrode 13 side as negative. In this case, in the light-emitting element 10, the P/N bonding layer emits light to obtain a desired display.

(Method of Manufacturing Display Device DSP)

Hereinafter, a method of manufacturing a display device DSP according to an embodiment will be described with reference to the drawings.

Figure 4:
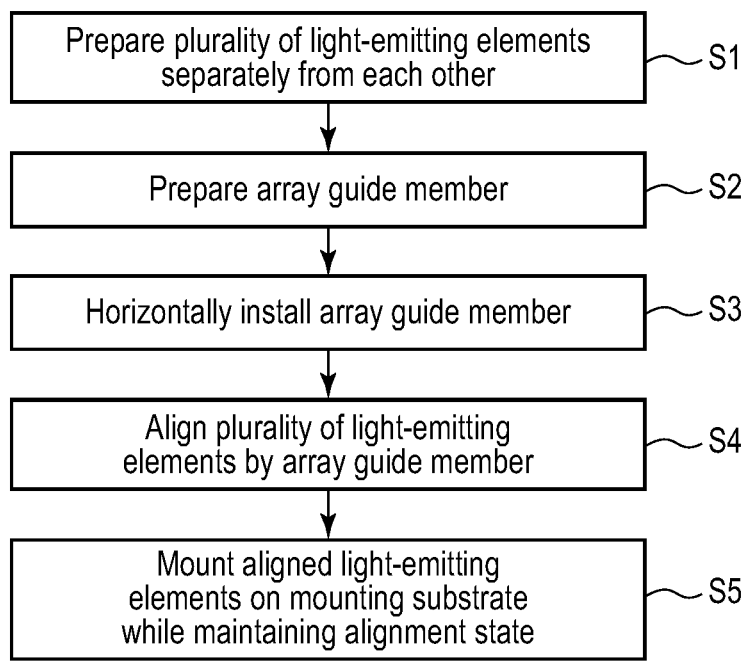
FIG. 4 is a flowchart illustrating a method of manufacturing a display device according to the embodiment.
Figure 5:
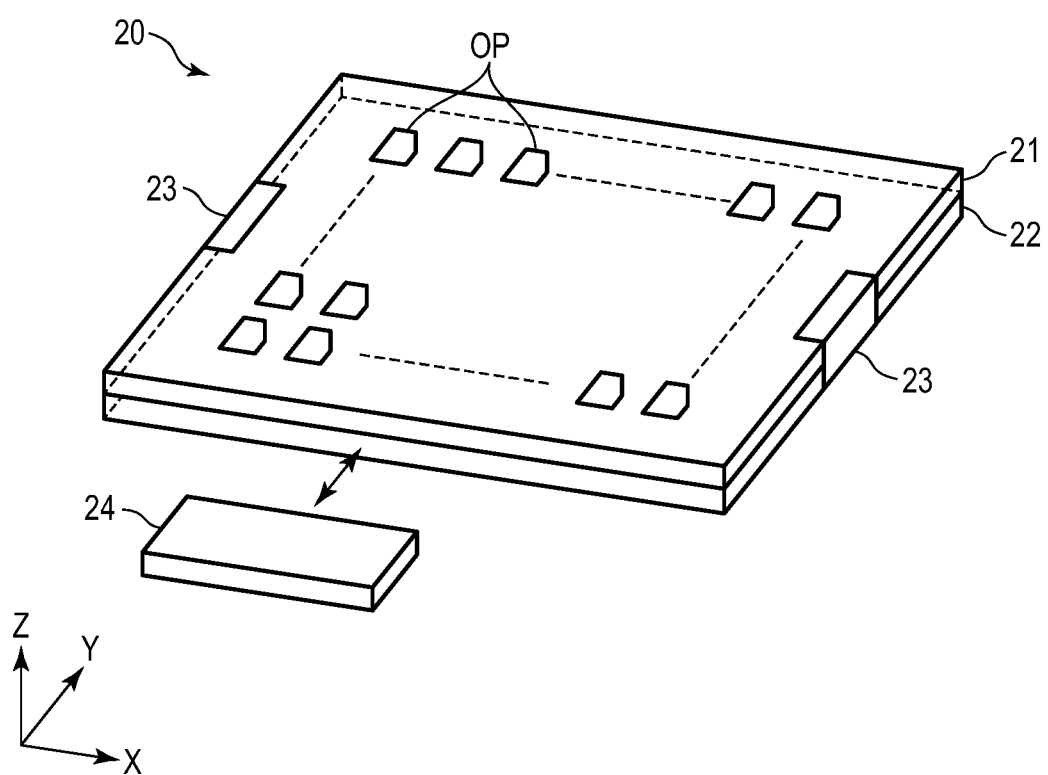
FIG. 5 is a perspective view schematically illustrating a light-emitting element alignment device used in the method of manufacturing a display device according to the embodiment.
Figure 7:
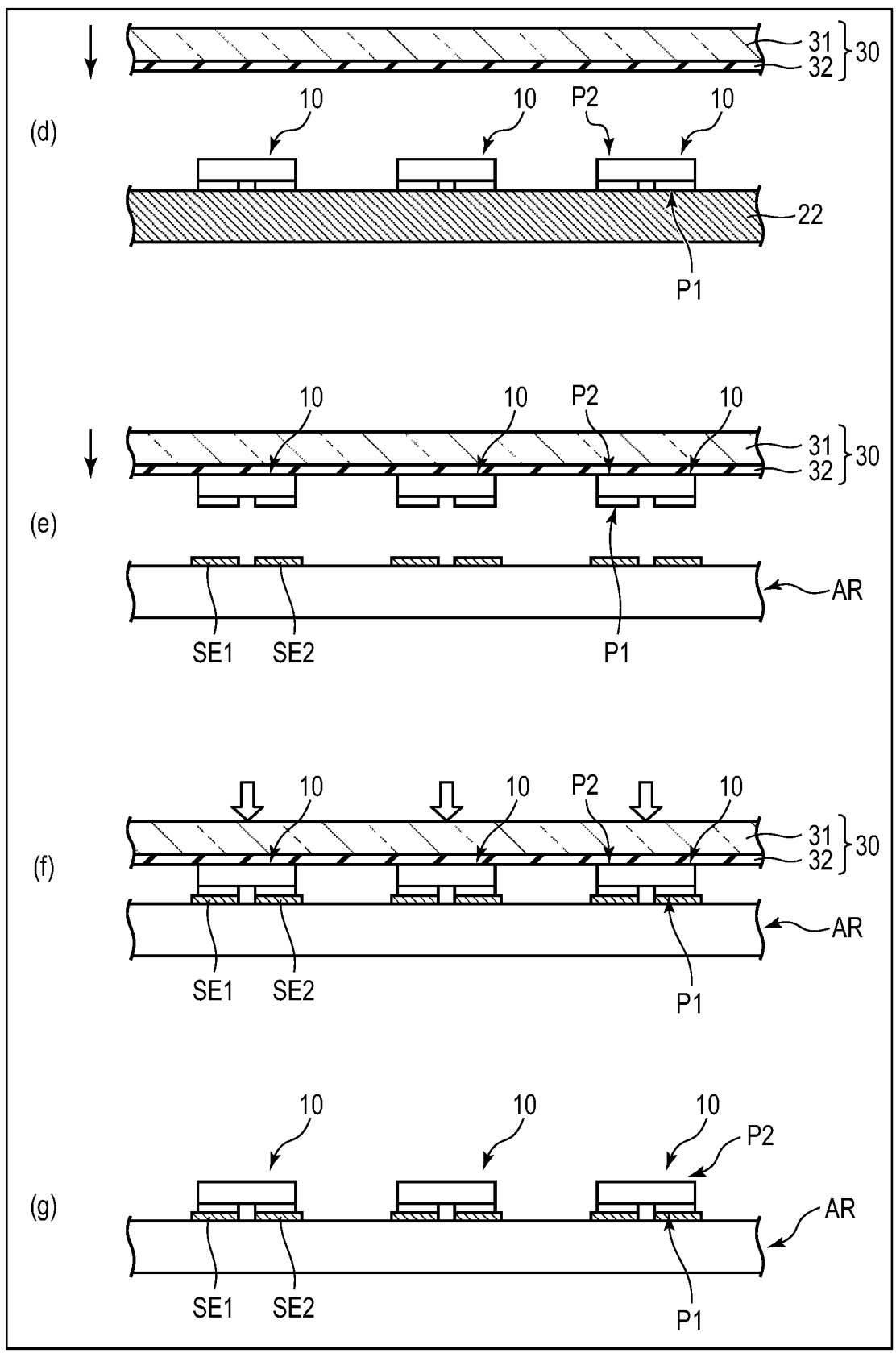
FIG. 7 is a schematic partial cross-sectional view sequentially illustrating a mounting step.

FIG. 4 is a flowchart illustrating a method of manufacturing a display device according to the embodiment. FIG. 5 is a perspective view schematically illustrating a light-emitting element alignment device used in the method of manufacturing a display device according to the embodiment. FIG. 6 is a schematic partial cross-sectional view sequentially illustrating an aligning step. FIG. 7 is a schematic partial cross-sectional view sequentially illustrating a mounting step.

First, the plurality of light-emitting elements 10 are prepared separately from each other (step S1).

Hereinafter, a procedure for integrating and forming the above-described light-emitting elements 10 on a polycrystalline sapphire substrate will be described. First, a single crystal sapphire substrate (wafer) that is an insulating base layer is prepared. Next, a low-temperature and high-temperature buffer layer is formed on the single-crystal sapphire substrate, and then, a second conductivity-type clad layer, an active layer, and a first conductivity-type clad layer are stacked by a conventional method to form a light emitting layer. By the stacking, a light-emitting diode having a double heterostructure is formed. Next, by the conventional method, an n-type electrode (first electrode) is formed so as to be electrically connected to the second conductivity-type clad layer, and a p-type electrode (second electrode) is formed so as to be electrically connected to the first conductivity-type clad layer. Next, by a semiconductor process such as photolithography, a separation groove that separates each of the light-emitting elements 10 to a position where the sapphire substrate is exposed and the notch are formed. In addition, the separation groove and the notch may be formed using a dicing process instead of the photolithography. Further, the splitting groove and the notch may be formed by combining the photolithography and the dicing process. Through the above steps, the light-emitting elements 10 can be integrated and formed on the sapphire substrate (wafer).

Next, the plurality of light-emitting elements 10 integrally formed on the sapphire substrate are separated from the sapphire substrate. As the separation method, a method such as laser lift-off can be used. In the method, first, the light-emitting element 10 to be separated is irradiated with a high-power pulse laser such as an excimer laser from the sapphire substrate side. By the laser irradiation, for example, a gallium nitride layer is decomposed in the vicinity of an interface between the sapphire substrate and the second conductivity-type clad layer as a crystal layer, and a bonding force of the interface is weakened, and thus, the separation can be performed.

In the present embodiment, as the plurality of light-emitting elements 10 prepared separately, those that do not include an insulating base layer such as a sapphire substrate are used. In such a configuration, since the light-emitting element 10 does not include a hard insulating base layer, the above-described planar shape of the light-emitting element 10 can be easily formed by a fine processing technique such as a semiconductor process. In addition, since the thickness T of the light-emitting element 10 can be reduced, the thickness of the display device DSP can be preferably reduced.

Note that, as the plurality of light-emitting elements 10 to be separately prepared, it is possible to use light-emitting elements that are separated and dispersed from a wafer that cannot be used before and is discarded, or light-emitting elements at positions that do not conform to the pixel array of the mounting substrate AR on an integrally formed wafer.

Next, the array guide member 21 is prepared (step S2).

As illustrated in FIG. 5, the array guide member 21 includes a base and an opening portion group OP that has a plurality of opening portions two-dimensionally arrayed on the base and penetrating therethrough. The array guide member 21 is installed horizontally, and is configured such that each of the plurality of light-emitting elements 10 is fitted into the opening portion group OP of the array guide member 21, and the plurality of light-emitting elements 10 can be aligned following the two-dimensional array of the opening portion group OP.

The base has a plate shape and has, for example, a rectangular outer shape. The thickness of the base is preferably equivalent to the thickness T of the light-emitting element 10 to be aligned. The base has an upper surface positioned on an upper side and a lower surface positioned on a lower side when horizontally disposed. When the base is a material such as silicon or silicon oxide, the fine opening portion group OP can be formed by a semiconductor process such as photolithography.

In the present embodiment, the planar shape of each opening portion of the opening portion group OP viewed from the upper surface side has a shape similar to the planar shape of the light-emitting element 10 viewed from the main light emitting surface P2 side. Specifically, similarly to the planar shape of the light-emitting element 10 described above, each opening portion of the opening portion group OP has a planar shape obtained by notching one of four rectangular corner portions in a non-linearly symmetric triangular shape. In the present embodiment, a posture of each opening portion of the opening portion group OP viewed from the upper surface side coincides with the posture of the light-emitting element 10 on the mounting substrate AR. Specifically, each opening portion of the opening portion group OP is aligned in a posture in which the notch 15 is directed to the upper right similarly to the posture of the light-emitting element 10 on the mounting substrate AR. Each opening portion of the opening portion group OP has a shape similar to the planar shape of the light-emitting element 10 described above and a slightly large dimension. A planar area of each opening portion of the opening portion group OP is formed to be slightly larger, for example, 1% to 10% larger than that of the light-emitting element 10.

In the present embodiment, center points of each opening portion of the opening portion group OP are arrayed at intervals dX in the first direction X and at intervals dY in the second direction Y, similarly to the two-dimensional array of the light-emitting elements 10 on the mounting substrate AR. That is, the two-dimensional array of each opening portion of the opening portion group OP coincides with the two-dimensional array of the light-emitting elements 10 on the mounting substrate AR.

Next, the prepared array guide member 21 is horizontally installed (step S3).

In the present embodiment, the array guide member 21 is disposed on an alignment plate 22 disposed horizontally. The alignment plate 22 has a plate shape and is disposed on the lower surface of the array guide member 21 so as to cover the opening portion group OP. The alignment plate 22 has a rectangular outer shape having the same dimension as the array guide member 21.

In the present embodiment, the array guide member 21 and the alignment plate 22 are fixed by a fixture 23 so as not to be displaced from each other. The fixture 23 is, for example, a member that clamps and fixes outer edges of the array guide member 21 and the alignment plate 22. In the present embodiment, the array guide member 21 is connected to a vibration mechanism and a swing mechanism 24 capable of finely vibrating and swinging the member. The array guide member 21 and the alignment plate 22 are integrally configured to be vibrated and swung by the vibration mechanism and the swing mechanism 24.

Next, each of the plurality of light-emitting elements 10 is fitted into the opening portion group OP of the array guide member 21, and the plurality of light-emitting elements 10 are aligned following the two-dimensional array of the opening portion group OP (step S4).

The aligning step will be described with reference to (a), (b) and (c) of FIG. 6.

First, as illustrated in (a) of FIG. 6, the plurality of light-emitting elements 10 separated from each other are mounted above the array guide member 21 and the alignment plate 22 installed horizontally and on the upper surface of the array guide member 21.

Next, as illustrated in (b) of FIG. 6, the array guide member 21 and the alignment plate 22 are swung and vibrated by the vibration mechanism and the swing mechanism 24, and the plurality of light-emitting elements 10 are moved and rotated on the array guide member 21. When the plurality of light-emitting elements 10 match the two-dimensional array and posture of each opening portion of the opening portion group OP by the movement and rotation, each of the plurality of light-emitting elements 10 is fitted into the opening portion group OP as illustrated in (c) of FIG. 6. In the present embodiment, each of the light-emitting elements 10 is fitted into each opening portion group OP with the mounting surface P1 side facing downward.

Specifically, in each light-emitting element 10, the light-emitting element 10 is fitted into the opening portion of the opening portion group OP only in a posture of an angle at which the light-emitting element 10 coincides with the opening portion of the opening portion group OP on the plane. This is because each light-emitting element 10 has a planar shape having non-rotational symmetry with respect to an axis line perpendicular to the plane. In addition, in each light-emitting element 10, the light-emitting element 10 is fitted into the opening portion of the opening portion group OP only in a posture in which the mounting surface P1 of the light-emitting element 10 is on the lower side. This is because each light-emitting element 1 has a planar shape that is non-linearly symmetric with respect to an axis line parallel to a plane. Further, each of the light-emitting elements 10 is fitted into the plurality of opening portions of the opening portion group OP, and is aligned on the alignment plate 22 following the two-dimensional alignment of the opening portions of the array guide member 21.

Next, the plurality of aligned light-emitting elements 10 are mounted on the mounting substrate AR while maintaining the alignment (step S5).

The mounting step will be described with reference to (d), (e), (f) and (g) of FIG. 7.

First, as illustrated in (d) of FIG. 7, the array guide member 21 is removed from above the alignment plate 22, and the transfer plate 30 is prepared. The transfer plate 30 is a temporary substrate for transferring the light-emitting element 10 while maintaining the alignment. An adhesive layer 32 is applied to the surface of the base 31 of the transfer plate 30.

Subsequently, as illustrated in (d) of FIG. 7, the surface of the adhesive layer 32 of the transfer plate 30 is pressed to the main light emitting surface P2 of the aligned light-emitting element 10. As a result, the main light emitting surface P2 side of each light-emitting element 10 adheres to and holds the surface of the adhesive layer 32. By this operation, the plurality of light-emitting elements 10 are transferred to the transfer plate 30 while maintaining the alignment.

Next, as illustrated in (e) of FIG. 7, the mounting substrate AR is prepared. Various wiring layers (not illustrated), a pixel circuit (not illustrated), a first wiring electrode SE1, a second wiring electrode SE2, and the like are formed in advance on the mounting substrate AR. As described above, the pair of first wiring electrode SE1 and second wiring electrode SE2 is disposed on the upper surface of the mounting substrate AR and functions as a mounting region of the light-emitting element 10. A bonding conductive material is formed in advance on the first wiring electrode SE1 and the second wiring electrode SE2. Next, as illustrated in (e) of FIG. 7, the transfer plate 30 is mounted on the first wiring electrode SE1 and the second wiring electrode SE2 of the mounting substrate AR by aligning the positions of the first electrode 12 and the second electrode 13 respectively.

Subsequently, as illustrated in (f) of FIG. 7, the mounting surface P1 of the light-emitting element 10 on the transfer plate 30 is pressed to a matched position on the mounting substrate AR. Thereafter, as illustrated in (f) of FIG. 7, the adhesive layer 32 adhering to the light-emitting element 10 to be mounted is irradiated with a laser beam. As a result, the adhesive layer 32 is broken, and each light-emitting element 10 is removed from the transfer plate 30. As a result, the plurality of light-emitting elements 10 are transferred and mounted on the mounting substrate AR while maintaining the alignment on the transfer plate 30 ((g) of FIG. 7).

The display device DSP in which the light-emitting elements 10 are two-dimensionally arrayed on the mounting substrate AR can be manufactured by repeatedly performing the mounting process on all the pixels (all mounting regions on the mounting substrates AR).

In the method of manufacturing the display device DSP according to the present embodiment, since the plurality of light-emitting elements 10 are formed in a predetermined planar shape in advance, the posture and the two-dimensional array of the light-emitting elements 10 can be aligned by the array guide member 21. The light-emitting element described above is fitted only in a predetermined posture and two-dimensional array with respect to the opening portion group OP having a plurality of opening portions having a planar shape similar in shape to the light-emitting element 10 and a slightly large dimension. For this reason, a large number of light-emitting elements 10 having a fine dimension can be aligned with high accuracy, and the transfer and mounting of the light-emitting elements 10 onto the mounting substrate AR can be efficiently performed. Therefore, according to the present embodiment, the display device DSP can be efficiently manufactured, and the display device DSP with a reduced manufacturing cost can be provided.

Furthermore, according to the method of manufacturing the display device DSP according to the present embodiment, the plurality of light-emitting elements 10 separated from each other can be efficiently aligned. For this reason, it is possible to manufacture the display device DSP by reusing the light-emitting elements separated and dispersed from the integrally formed wafer which cannot be used before and discarded, or the light-emitting elements at positions that do not adapt the pixel array of the mounting substrate AR on the integrally formed wafer. As a result, the manufacturing cost of the display device DSP can be further reduced.

Furthermore, according to the method of manufacturing a display device DSP according to the present embodiment, in the aligning step, the array guide member is swung and vibrated to move and rotate the plurality of light-emitting elements 10. As a result, the plurality of light-emitting elements 10 can be efficiently fitted into the opening portion group OP. As a result, the plurality of light-emitting elements 10 can be efficiently aligned by the array guide member 21.

Furthermore, according to the method of manufacturing a display device DSP according to the present embodiment, in the aligning step, the light-emitting elements 10 are aligned with the mounting surface P1 including the first electrode 12 and the second electrode 13 facing downward. For this reason, in the mounting step subsequent to the aligning step, since the main light emitting surface P2 side of the light-emitting element 10 can be held by the transfer plate 30, the mounting surface P1 on the opposite side thereto can be mounted on the mounting substrate AR. As a result, in the mounting step, it is possible to mount the light-emitting element 10 without inverting the upper and lower surfaces of the light-emitting element, and it is possible to further improve the efficiency of mounting the light-emitting element 10 on the mounting substrate AR.

In the above embodiment, an example in which the two-dimensional array of the plurality of opening portions of the opening portion group OP of the array guide member 21 matches the two-dimensional array of the light-emitting elements 10 on the mounting substrate AR has been described, but the present invention is not limited thereto. The two-dimensional array of the plurality of opening portions of the opening portion group OP may be enlarged or reduced at a predetermined magnification in the first direction X and/or the second direction Y as compared with the two-dimensional array of the light-emitting elements 10 on the mounting substrate AR. For example, it is preferable to reduce the dimensions of the array guide member 21 by reducing the two-dimensional array of the plurality of opening portions of the opening portion group OP of the array guide member 21 and arrange the plurality of opening portions densely as described above. When the plurality of opening portions of the opening portion group OP of the array guide member 21 are densely arranged, the probability that each of the plurality of light-emitting elements 10 are fitted into the plurality of opening portions of the opening portion group OP increases in the aligning step described above. As a result, the aligning step can be made more efficient. In that case, in the mounting step, it is necessary to magnify and mount the two-dimensional array of the plurality of light-emitting elements 10 densely aligned in the aligning step to a predetermined magnification.

Figure 8:
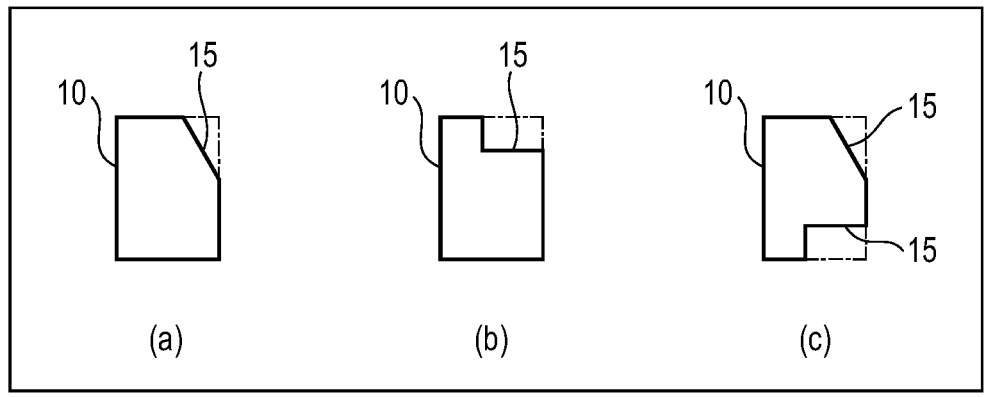
FIG. 8 is a plan view illustrating another example of a planar shape of the light-emitting element.

In the above embodiment, as illustrated in (a) of FIG. 8, the light-emitting element 10 has a planar shape in which one of four rectangular corner portions is notched in a non-linearly symmetric triangular shape. However, the shape of the light-emitting element 10 is not limited thereto, and may have the above-described non-rotational symmetry and non-linear symmetry. The light-emitting element 10 may have a notch other than the triangular shape. For example, as illustrated in (b) of FIG. 8, the light-emitting element 10 may have a planar shape in which one of four rectangular corner portions is notched in a rectangular shape. In addition, the light-emitting element 10 may have two or more notches. For example, as illustrated in (c) of FIG. 8, the light-emitting element 10 may have a planar shape in which one of four rectangular corner portions is notched in a triangular shape and another corner portion is notched in a rectangular shape. In addition, the schematic shape of the light-emitting element may be a shape other than a rectangle, and may be another polygonal shape such as a triangular shape, a circular shape, or the like.

(Method of Manufacturing Display Device According to Another Embodiment)

A method of manufacturing a display device according to another embodiment will be described. Hereinafter, a display device that can be manufactured by a method of manufacturing a display device according to another embodiment will be described.

Figure 9:
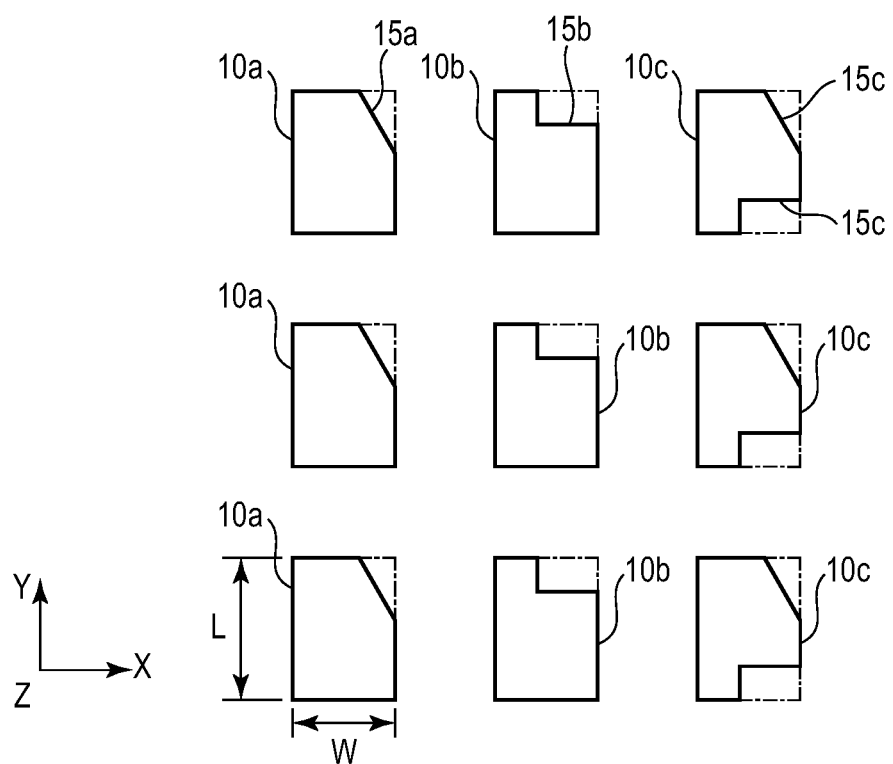
FIG. 9 is a plan view illustrating a planar shape and a two-dimensional array of a plurality of light-emitting elements included in a display device that can be manufactured by a method of manufacturing a display device according to another embodiment.

FIG. 9 is a plan view schematically illustrating a planar shape and a two-dimensional array of a plurality of light-emitting elements included in a display device that can be manufactured by a method of manufacturing a display device according to another embodiment. A plurality of light-emitting elements 10 include a first light-emitting element 10a exhibiting a first color, a second light-emitting element 10b exhibiting a second color, and a third light-emitting element 10c exhibiting a third color, and are different in a planar shape from each other. For example, the first color is red, the second color is green, and the third color is blue.

In the display device, the first light-emitting element 10a has a planar shape similar to that in (a) of FIG. 8 described above, the second light-emitting element 10b has a planar shape similar to that in (b) of FIG. 8 described above, and the third light-emitting element 10c has a planar shape similar to that in (c) of FIG. 8. For example, a width W, a length, and a thickness T, which are schematic dimensions of the light-emitting elements 10a, 10b, and 10c, are the same, respectively. The light-emitting elements 10a, 10b, and 10c are aligned in a posture in which the notches 15a, 15b, and 15c are directed to the upper right, respectively. The light-emitting elements 10a, 10b, and 10c are arrayed along a second direction Y along the two-dimensional array of the light-emitting elements 10 described above, and are alternately arrayed in this order in a first direction X.

In such a method of manufacturing a display device, in the step of preparing the array guide member, it is preferable to prepare a first array guide member that includes an opening portion group having a plurality of opening portions that have a planar shape similar in shape to the first light-emitting element 10a and a slightly large dimension, a second array guide member that includes an opening portion group having a plurality of opening portions that have a planar shape similar in shape to the second light-emitting element 10b and a slight large dimension, and a third array guide member including an opening portion group having a plurality of opening portions that have a planar shape similar in shape to the third light-emitting element 10c and a slightly large dimension.

It is preferable that the first light-emitting elements 10a are fitted into the first opening portion group of the first array guide member, respectively, and are not fitted into the second opening portion group of the second array guide member and the third opening portion group of the third array guide member, respectively. It is preferable that the second light-emitting elements 10b are fitted into the second opening portion group of the second array guide member, respectively, and are not fitted into the first opening portion group of the first array guide member and the third opening portion group of the third array guide member, respectively. It is preferable that the third light-emitting elements 10c are fitted into the third opening portion group of the third array guide member, respectively, and are not fitted into the first opening portion group of the first array guide member and the second opening portion group of the second array guide member, respectively.

In addition, it is preferable that the aligning step preferably includes a first aligning step of aligning the first light-emitting elements 10a by the first array guide member, a second aligning step of aligning the second light-emitting elements 10b by the second array guide member, and a third aligning step of aligning the third light-emitting elements 10c by the third array guide member.

Furthermore, it is preferable that the mounting step includes a first mounting step of mounting the first light-emitting elements 10a aligned in the first aligning step on the mounting substrate while maintaining the alignment, a second mounting step of mounting the second light-emitting elements 10b aligned in the second aligning step on the mounting substrate while maintaining the alignment, and a third mounting step of mounting the third light-emitting elements 10c aligned in the third aligning step on the mounting substrate while maintaining the alignment.

Hereinafter, a method of manufacturing a display device according to another embodiment will be described.

First, as the light-emitting elements separated from each other to be prepared, for example, the light-emitting elements in which the light-emitting elements 10a, 10b, and 10c are mixed can be used (step S1').

Next, the first array guide member is horizontally disposed and fixed on the alignment plate (step S2'). Next, the plurality of light-emitting elements are put on the first array guide member (step S3'), and the first light-emitting elements 10a are aligned on the alignment plate by the first array guide member (first aligning step (step S4')). In this case, since the planar shapes of the light-emitting elements 10a, 10b, and 10c are different from each other, and the planar shapes of the first opening portion group, the second opening portion group, and the third opening portion group having similar shapes and slightly large dimensions are also different from each other, only the first light-emitting element 10a is selectively aligned by the first array guide member. Next, the aligned first light-emitting elements 10a on the alignment plate are transferred to the transfer plate while maintaining the alignment, and mounted on the corresponding mounting region on the mounting substrate (first mounting step (step S5')).

Next, in place of the first array guide member, the second array guide member is horizontally disposed and fixed on the alignment plate (step S2'). Next, the plurality of light-emitting elements remaining on the first array guide member are put on the second array guide member (step S3'), and the second light-emitting elements 10b are selectively aligned on the alignment plate by the second array guide member (second aligning step (step S4')). Next, the aligned second light-emitting elements 10b on the alignment plate are transferred to the transfer plate while maintaining the alignment, and mounted on the corresponding mounting region on the mounting substrate AR (second mounting step (step S5')).

Next, in place of the second array guide member, the third array guide member is horizontally disposed and fixed on the alignment plate (step S2'). Next, the plurality of light-emitting elements remaining on the second array guide member are put on the third array guide member (step S3'), and the third light-emitting elements 10c are selectively aligned on the alignment plate by the third array guide member (third aligning step (step S4')). Next, the aligned third light-emitting elements 10c on the alignment plate are transferred to the transfer plate while maintaining the alignment, and mounted on the corresponding mounting region on the mounting substrate AR (third mounting step (step S5')).

In the method of manufacturing a display device DSP according to another embodiment, the same effect as that of the above embodiment can be obtained. Furthermore, in such a configuration, as the light-emitting element to be mounted, it is possible to manufacture the display device DSP by reusing the light-emitting elements which are separated from the integrally formed wafer which cannot be used before and is discarded and in which the light-emitting elements 10a, 10b, and 10c are mixed. As a result, the manufacturing cost of the display device DSP can be further reduced.

Note that, in the method of manufacturing a display device according to the above-described another embodiment, the light-emitting elements in which the light-emitting elements 10a, 10b, and 10c are mixed are used, but the light-emitting elements selected from each other may be used. Specifically, the light-emitting elements 10a, 10b, and 10c may be mounted on the mounting substrate by different alignment processes and mounting processes. In addition, although the light-emitting elements 10a, 10b, and 10c have been described as having different shapes of the notches 15, for example, when the planar shapes are different, the schematic shapes may be other polygonal shapes such as a triangular shape, a circular shape, or the like, and may be greatly different from each other. Furthermore, the light-emitting elements 10a, 10b, and 10c may have, for example, similar shapes and different planar areas, and may have, for example, a configuration in which the planar areas are reduced in this order. In such a configuration, it is preferable to perform each aligning step after selected by the array guide member having the opening portion group corresponding to the difference in the schematic shape or planar area of the light-emitting elements 10a, 10b, and 10c.

In addition, the display device manufactured in the above-described embodiment is not limited to the above-described example, and some members may be added or omitted. For example, an insulating layer may be formed on the first wiring electrode and the second wiring electrode disposed on the mounting substrate. An opening portion may be formed in the insulating layer so that a part of the first wiring electrode and the second wiring electrode is exposed, and the first electrode and the second electrode of the light-emitting element may be connected to the exposed portion. In addition, a planarizing film that covers and planarizes the plurality of light-emitting elements and the insulating layer may be formed on the mounting substrate.

Furthermore, in the display device manufactured in the above embodiment, an example in which the light-emitting element 10 is a so-called flip chip type micro LED has been described, but the present invention is not limited thereto. For example, the light-emitting element may be a so-called face-up type micro LED, or may be a light-emitting element 10' that includes a first electrode 12' disposed below a light emitting layer 11' and a second electrode 13' disposed above the light emitting layer 11' as illustrated in FIG. 10.

Hereinafter, a display device DSP' according to another example illustrated in FIG. 10 will be described. FIG. 10 is a schematic partial cross-sectional view schematically illustrating another example of the display device. The light-emitting element 10' has a planar shape and an outer dimension similar to those of the light-emitting element 10'. The light-emitting elements 10' are two-dimensionally arrayed and mounted on a mounting substrate AR' similarly to the light-emitting elements 10. The light-emitting element 10' is mounted on a first wiring electrode SE1'. The first wiring electrode SE1' is formed on an upper surface of the mounting substrate AR' according to each of the plurality of light-emitting elements 10'. The first wiring electrodes SE1' are disposed in the same two-dimensional array as the first wiring electrodes SE1 and the second wiring electrodes SE2 on the mounting substrate AR'. The first electrode 12' is disposed on and electrically connected to the first wiring electrode SE1'. The first electrode 12' and the second electrode 13' are disposed to face each other with the light emitting layer 11' interposed therebetween. In the light-emitting element 10', the side including the first electrode 12' functions as a mounting surface P1, and the side including the second electrode 13' functions as a main light emitting surface P2.

A space between the plurality of light-emitting elements 10' mounted on the mounting substrate AR is filled with an inter-element insulating film PS. An upper surface of the inter-element insulating film PS is planarized so that the second electrode 13' of the light-emitting element 10' is exposed. A counter electrode CE made of a transparent conductive film such as indium oxide is formed on the inter-element insulating film PS and the second electrode 13'. The counter electrode CE is commonly connected to the second electrodes 13' of the plurality of light-emitting elements 10'. In the light-emitting element 10', when a current is supplied through the first wiring electrode SE1 and the counter electrode CE with the first electrode 12' side as positive and the second electrode 13' side as negative, a P/N junction layer emits light to obtain a desired display.

The display device DSP' having such a configuration can also be manufactured in the same manner as the method of manufacturing a display device DSP according to the above embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a display device including a mounting substrate and a plurality of light-emitting elements two-dimensionally arrayed and mounted on the mounting substrate, the plurality of light-emitting elements having a planar shape that is non-rotationally symmetric with respect to an axis line perpendicular to a plane of the two-dimensional array and is non-linearly symmetric with respect to an axis line parallel to the plane of the two-dimensional array, the method comprising:
    preparing the plurality of light-emitting elements separated from each other;
    preparing an array guide member that includes a plate-like base and an opening portion group that is two-dimensionally arrayed on the base and has a plurality of opening portions having a shape similar to a planar shape of the light-emitting element and a slightly large dimension and penetrating therethrough; and
    installing the array guide member horizontally, fitting the plurality of light-emitting elements into the plurality of opening portions of the opening portion group of the array guide member, and aligning the plurality of light-emitting elements following the two-dimensional array of the opening portion group,
    wherein, in the aligning, the plurality of light-emitting elements are put on the array guide member, the array guide member is swung and vibrated, and the plurality of light-emitting elements are moved and rotated to fit the plurality of light-emitting elements into the opening portion group.

2. The method of manufacturing a display device according to claim 1, wherein each of the plurality of light-emitting elements is a plate-like micro light-emitting diode.

3. The method of manufacturing a display device according to claim 1, further comprising: mounting the plurality of aligned light-emitting elements on the mounting substrate while maintaining the alignment of the light-emitting elements.

4. The method of manufacturing a display device according to claim 1, wherein each of the plurality of light-emitting elements has a planar shape in which one of four rectangle corner portions is notched.

5. A method of manufacturing a display device including a mounting substrate and a plurality of light-emitting elements two-dimensionally arrayed and mounted on the mounting substrate, the plurality of light-emitting elements having a planar shape that is non-rotationally symmetric with respect to an axis line perpendicular to a plane of the two-dimensional array and is non-linearly symmetric with respect to an axis line parallel to the plane of the two-dimensional array, the method comprising:
    preparing the plurality of light-emitting elements separated from each other;
    preparing an array guide member that includes a plate-like base and an opening portion group that is two-dimensionally arrayed on the base and has a plurality of opening portions having a shape similar to a planar shape of the light-emitting element and a slightly large dimension and penetrating therethrough; and
    installing the array guide member horizontally, fitting the plurality of light-emitting elements into the plurality of opening portions of the opening portion group of the array guide member, and aligning the plurality of light-emitting elements following the two-dimensional array of the opening portion group,
    wherein, in the aligning, a plate-like alignment plate disposed to cover the opening portion group is fixedly disposed on a lower surface of the array guide member, and the plurality of light-emitting elements are aligned on the alignment plate following the opening portion group.

6. A method of manufacturing a display device including a mounting substrate and a plurality of light-emitting elements two-dimensionally arrayed and mounted on the mounting substrate, the plurality of light-emitting elements having a planar shape that is non-rotationally symmetric with respect to an axis line perpendicular to a plane of the two-dimensional array and is non-linearly symmetric with respect to an axis line parallel to the plane of the two-dimensional array, the method comprising:
    preparing the plurality of light-emitting elements separated from each other;

preparing an array guide member that includes a plate-like base and an opening portion group that is two-dimensionally arrayed on the base and has a plurality of opening portions having a shape similar to a planar shape of the light-emitting element and a slightly large dimension and penetrating therethrough; and installing the array guide member horizontally, fitting the plurality of light-emitting elements into the plurality of opening portions of the opening portion group of the array guide member, and aligning the plurality of light-emitting elements following the two-dimensional array of the opening portion group, mounting the plurality of aligned light-emitting elements on the mounting substrate while maintaining the alignment of the light-emitting elements, wherein, in the mounting, the plurality of aligned light-emitting elements are transferred onto a transfer plate while maintaining the alignment of the light-emitting elements, and then are transferred from the transfer plate onto the mounting substrate to be mounted.

7. The method of manufacturing a display device according to claim 6, wherein, in the aligning, main light emitting surface sides of the plurality of light-emitting elements are aligned upward, and, in the mounting, the main light emitting surface side of the light-emitting element is maintained by the transfer plate, and is transferred onto the mounting substrate to be mounted.

8. A method of manufacturing a display device including a mounting substrate and a plurality of light-emitting elements two-dimensionally arrayed and mounted on the mounting substrate, the plurality of light-emitting elements having a planar shape that is non-rotationally symmetric with respect to an axis line perpendicular to a plane of the two-dimensional array and is non-linearly symmetric with respect to an axis line parallel to the plane of the two-dimensional array, the method comprising:

preparing the plurality of light-emitting elements separated from each other;

preparing an array guide member that includes a plate-like base and an opening portion group that is two-dimensionally arrayed on the base and has a plurality of opening portions having a shape similar to a planar shape of the light-emitting element and a slightly large dimension and penetrating therethrough; and installing the array guide member horizontally, fitting the plurality of light-emitting elements into the plurality of opening portions of the opening portion group of the array guide member, and aligning the plurality of light-emitting elements following the two-dimensional array of the opening portion group, wherein the plurality of prepared light-emitting elements include a first light-emitting element exhibiting a first color, a second light-emitting element exhibiting a second color, and a third light-emitting element exhibiting a third color, and the first light-emitting element, the second light-emitting element, and the third light-emitting element are different in a planar shape from each other, the array guide member to be prepared includes a first array guide member that includes a first opening portion group having a plurality of opening portions having a shape similar to the planar shape of the first light-emitting element and a slightly large dimension and penetrating therethrough, a second array guide member that includes a second opening portion group having a plurality of opening portions having a shape similar to the planar shape of the second light-emitting element and a slightly large dimension and penetrating therethrough, and a third array guide member that includes a third opening portion group having a plurality of opening portions having a shape similar to the planar shape of the third light-emitting element and a slightly large dimension and penetrating therethrough, and the aligning includes aligning the first light-emitting element following a two-dimensional array of the first opening portion group by the first array guide member, aligning the second light-emitting elements following a two-dimensional array of the second opening portion group by the second array guide member, and aligning the third light-emitting elements following a two-dimensional array of the third opening portion group by the third array guide member.

* * * * *